(12) United States Patent
Yamaguchi

(10) Patent No.: US 8,188,777 B2
(45) Date of Patent: May 29, 2012

(54) CHARGE PUMP CIRCUIT AND PLL CIRCUIT USING THE SAME

(75) Inventor: Kouichiro Yamaguchi, Osaka (JP)

(73) Assignee: ICOM Incorporated (JP)

( * ) Notice: Subject to any disclaimer, the term of this patent is extended or adjusted under 35 U.S.C. 154(b) by 127 days.

(21) Appl. No.: 12/840,550

(22) Filed: Jul. 21, 2010

(65) Prior Publication Data

US 2011/0050302 A1    Mar. 3, 2011

(30) Foreign Application Priority Data

Aug. 26, 2009 (JP) ................................. 2009-195294

(51) Int. Cl.
*H03L 7/06* (2006.01)

(52) U.S. Cl. ......................... 327/157; 327/148; 331/17

(58) Field of Classification Search .................. 327/148, 327/157

See application file for complete search history.

(56) References Cited

U.S. PATENT DOCUMENTS

| | | | | |
|---|---|---|---|---|
| 5,101,117 A * | 3/1992 | Johnson et al. | ............... | 327/149 |
| 6,181,210 B1 * | 1/2001 | Wakayama | ....................... | 331/8 |
| 6,229,362 B1 * | 5/2001 | Choi | ............................. | 327/157 |
| 6,611,161 B1 * | 8/2003 | Kumar et al. | ................. | 327/157 |
| 6,664,829 B1 * | 12/2003 | Hughes | .......................... | 327/157 |
| 6,727,735 B2 * | 4/2004 | Park | ............................... | 327/157 |
| 7,701,271 B1 * | 4/2010 | Sanielevici et al. | ........... | 327/157 |
| 2008/0157834 A1 * | 7/2008 | Lin | ................................ | 327/157 |
| 2009/0243671 A1 * | 10/2009 | Draxelmayr | ................... | 327/157 |

* cited by examiner

*Primary Examiner* — Lincoln Donovan
*Assistant Examiner* — Ryan Jager
(74) *Attorney, Agent, or Firm* — Gerald E. Hespos; Michael J. Porco

(57) ABSTRACT

A charge pump circuit (31), and a PLL circuit using the charge pump circuit, has a glitch compensation circuit (36) to compensate for a slow glitch which occurs along charging/discharging of electric charges in a parasitic capacitance. The glitch compensation circuit (36) includes a comparator (37), a latch circuit (38), a capacitor (C1) and transistors (Q9, Q10) serving as a charge/discharge device. The comparator (37) compares potentials and applies a logic output signal to the latch circuit (38), and the latch circuit (38) in response to output of the comparator, instructs the charge/discharge device to perform a charge or discharge operation to charge or discharge the capacitor so as to allow a potential at a second output terminal to come close to a potential at a first output terminal or a potential at a designated node in a loop filter of the PLL circuit.

6 Claims, 9 Drawing Sheets

CHARGE PUMP CIRCUIT AND PLL CIRCUIT USING THE SAME

BACKGROUND OF THE INVENTION

1. Field of the Invention

The present invention relates to a charge pump circuit suitably usable in a PLL circuit, and a PLL circuit using the charge pump circuit, and, more particularly, to glitch compensation.

2. Description of the Related Art

A PLL (Phase Locked Loop) synthesizer used in wireless devices, etc., is configured, for example, as shown in FIG. 7 where a VCO (Voltage Controlled Oscillator) 1, a reference frequency oscillator 3 and a loop filter 4 are externally attached to a PLL IC 2, and an oscillation frequency of the VCO 1 for use as a local oscillator or the like is controlled as follows.

An oscillation signal of the VCO 1 is input into the PLL IC 2, wherein a frequency of the oscillation signal is divided at a predetermined frequency-dividing ratio by a prescaler 5 and further divided by a frequency divider 6, and a resulting signal is input into a phase detector 7 as a frequency-divided signal. Meanwhile, an oscillation signal of the oscillator 3 is input into the PLL IC 2, wherein a frequency of the oscillation signal is divided by a frequency divider 8, and a resulting signal is input into the phase detector 7 as a frequency-divided signal. In cases where the phase detector 7 is configured as a tri-state type, it is operable to compare between respective phases of the frequency-divided signal from the VCO 1 and the frequency-divided signal from the oscillator 3, and output an error signal having a pulse width with the same time period as a difference between the phases, for example, as an UP signal, if the phase difference is a positive value, or as a DOWN signal, if the phase difference is a negative value.

A charge pump circuit 9 is operable, when the UP signal is input thereinto, to output (source) a given current value $I_{CP}$ from an output terminal thereof, just for the same time period as a pulse width of the UP signal, or, when the DOWN signal is input thereinto, to draw a given current value $I_{CP}$ from the output terminal thereof, just for the same time period as a pulse width of the DOWN signal, or, when both the UP and DOWN signals are in an OFF state, to place the output terminal in a high impedance state.

Current pulses output from the charge pump circuit 9 are converted into a voltage by a loop filter 4, and the voltage is applied from the loop filter 4 to the VCO 1 as a tuning voltage. In the PLL synthesizer in the example shown in FIG. 7, a phase comparison output from the phase detector 7 is controlled to become zero. In other words, a signal to be obtained by dividing a frequency of an oscillation signal of the VCO 1 by the frequency divider 6 is controlled to be synchronized and to have the same frequency with a signal obtained by dividing a frequency of an oscillation signal of the oscillator 3 by the frequency divider 8. A frequency-dividing ratio N in the frequency divider 6 is set to a desired value to allow the VCO 1 to output a stable oscillation signal having a frequency of $N \times f_{ref}$, wherein $f_{ref}$ is an oscillation frequency of the signal output from the frequency divider 8.

Such a PLL synthesizer requires a PLL charge pump circuit capable of outputting each of positive and negative constant currents having the same absolute value, just for the same time period as a pulse width of a respective one of the UP and DOWN signals, and in a certain output voltage range, accurately and rapidly. As an example of the PLL charge pump circuit, there has been known a circuit of a type in which each of a main-output side current path comprising series-connected two switches and having an output terminal, and an auxiliary-output side current path having the same configuration as that of the main-output side current path, is provided between current-supplying (current-sourcing) and current-drawing constant current sources, wherein one of the current path for a supply (source) current flow and the current path for a sink current flow is selected by the switches, so that an output of a positive or negative constant current is initiated or stopped at a timing designated by switching control input signals. For the sake of descriptive simplification, this type of charge pump will hereinafter be referred to as "differential switching charge pump (DSCP)".

FIG. 8 is a circuit diagram showing one example of a typical charge pump circuit 11 of the DSCP. In the charge pump circuit 11, a diode-connected PMOS transistor q1, a constant current source ic and a diode-connected NMOS transistor q2 are connected in series between two power supply lines 13, 14 from a DC power supply 12 generating a power supply voltage vdc. A gate of the PMOS transistor q1, and a gate of the NMOS transistor q2, are connected, respectively, to a gate of a PMOS transistor q3 of the same type and size as the PMOS transistor q1, and a gate of a NMOS transistor q4 of the same type and size as the NMOS transistor q2, to form current mirror circuits. A drain of the NMOS transistor q4 is connected to a source of an NMOS transistor q6 and a source of an NMOS transistor q8. A drain of the PMOS transistor q3 is connected to a source of a PMOS transistor q5 and a source of a PMOS transistor q7. The transistor q3 corresponds to the current-supplying constant current source, and the transistor q4 corresponds to the current-drawing constant current source. A drain of each of the transistors q7, q8 is connected to an output terminal 15 of the charge pump circuit 11, to provide the main-output side current path. A drain of the transistor q6 is connected to the positive power supply lines 13, and a drain of the transistor q5 is grounded, to provide the auxiliary-output side current path.

In cases where each of the UP signal and the DOWN signal from the phase detector 7 is output based on a positive logic, the UP signal, the DOWN signal, an UPB signal which is an inverted signal of the UP signal, and a DOWNB signal which is an inverted signal of the DOWN signal, are applied to a gate of the transistor q5, a gate of the transistor q8, a gate of the transistor q7, and a gate of the transistor q6, respectively.

The charge pump circuit 11 configured as above operates as follows. Given that an output current of the constant current source ic is "ic", a drain current of each of the transistors q3, q4 becomes equal to ic, ideally. When the UP signal is equal to "1", the transistor q7 is placed in an ON state, and the transistor q5 is placed in an OFF state, whereas, when the UP signal is equal to "0", the transistor q5 is placed in an ON state, and the transistor q7 is placed in an OFF state. Further, when the DOWN signal is equal to "1", the transistor q8 is placed in an ON state, and the transistor q6 is placed in an OFF state, whereas, when the DOWN signal is equal to "0", the transistor q6 is placed in an ON state, and the transistor q8 is placed in an OFF state.

Therefore, when the UP signal is "1" and the DOWN signal is "0", the drain current of the transistor q3 entirely flows toward the main-output side current path, so that a constant current having the current value ic is supplied from the charge-pump output terminal 15, whereas, when the UP signal is "0" and the DOWN signal is "1", the drain current of the transistor q4 entirely flows in from the main-output side current path, so that a constant current having the current value ic is sunk from the charge-pump output terminal 15. Further, when the UP signal is "0" and the DOWN signal is "0", the drain current of the transistor q4 entirely flows in from the auxiliary-output side current path, and the drain current of the transistor q3 entirely flows toward the auxiliary-output side current path, so that the charge-pump output terminal 15 is placed in the high impedance state.

In the above example, the drains of the transistors q7, q8 on the main-output side current path is connected to the loop filter 4 of the PLL circuit via the output terminal 15. Thus, when the transistor q7 is placed in the ON state and the transistor q5 is placed on the OFF state, a current is supplied from the charge pump circuit 11 to the loop filter, whereas, when the transistor q8 is placed in the ON state and the transistor q6 is placed on the OFF state, the charge pump circuit 11 draws a current from the loop filter. Further, each of the current to be supplied from the charge pump circuit 11 and the current to be sunk in the charge pump circuit 11 has the constant current value ic, ideally, the same value.

As above, the PLL charge pump circuit 11 is required to output each of positive and negative current pulses each having a constant value, rapidly and accurately according to a phase difference signal (the UP signal, the DOWN signal) input thereinto. However, generally, a current pulse output from the charge pump circuit 11 involves a so-called glitch, and thereby form a distorted waveform. The reason for distortion of the current pulse waveform can be explained as follows.

Given that: each of the transistors q5 to q8 is an ideal switch, i.e., has an ON-resistance of 0Ω; and a potential at a node p1 connecting to the sources of the transistors q5, q7 and the drain of the transistor q3, a potential at a node p2 connecting to the sources of the transistors q6, q8 and the drain of the transistor q4, and a potential at a node pa connecting to the drains of the transistors q7, q8 and the output terminal 15, are v1, v2 and va, respectively. Further, given that each of the transistors q3, q4 acts as an ideal constant current source, and the drain current thereof is constant irrespective of a drain-source voltage thereof.

Firstly, a source-current switching operation under a condition that the DOWN signal is "0" will be described. When the UP signal is "0", the transistor q7 and the transistor q5 are placed in the OFF state and the ON state, respectively, as mentioned above, and thereby the potential v1 becomes equal to a ground potential (0 V). Then, when the UP signal is changed from "0" to "1", the transistor q7 and the transistor q5 are changed to the ON state and the OFF state, respectively, as mentioned above, and thereby the potential v1 is changed from the ground potential to the potential va.

In this case, there is a parasitic capacitance between the drain and source of the transistor q3. Given that a value of the parasitic capacitance is $C_{ds3}$, a voltage $V_{ds3}=vdc-v1$ is applied to the parasitic capacitance, and a charge amount $Q_{ds3}=C_{ds3} \times V_{ds3}$ is charged in the parasitic capacitance. $V_{ds3}$ equals vdc before change of the UP signal. Along with the change in state of the UP signal, a voltage change $\Delta V_{ds3}=va$ occurs in the parasitic capacitance. Simultaneously, the charge amount to be charged in the parasitic capacitance is reduced by $\Delta Q_{ds3}=C_{ds3} \times va$. This means that electric charges are supplied from the parasitic capacitor to the loop filter 4 in a charge amount of $\Delta Q_{ds3}$ through the transistor switch q7 and the charge-pump output terminal 15, at and after a timing when the UP signal is changed from "0" to "1", because, generally, va>0 (V).

A charge-pump source current during a period where the charge transfer from the parasitic capacitor occurs has a value derived from adding a rate of the charge transfer to the constant current ic. This means that an ideal rectangular pulse waveform is distorted around a rising edge of a charge-pump output current pulse. Such a local error in the current pulse is called a glitch. Further, considering a sink-current switching operation under a condition that the UP signal is "0", it turns out that, in the charge pump circuit 11, a glitch also appears in a sink current pulse.

If the glitch occurs in a charge-pump output current pulse, phase noise characteristics of a PLL oscillation output will deteriorate. Thus, it is desirable to suppress the glitch. Therefore, as means to suppress a glitch in a charge-pump output current pulse, there is a technique as disclosed, for example, in U.S. Pat. No. 5,101,117 (D1). FIG. 9 shows a charge pump circuit 21 according to this conventional technique. The charge pump circuit 21 is similar to the aforementioned charge pump circuit 11. Thus, an equivalent element or component to that of the charge pump circuit 11 is defined by a common reference numeral or code, and its description will be omitted.

In the charge pump circuit 21, the drain of the transistor q5 is connected to the drain of the transistor q6. Given that a potential of a node pb therebetween is vb. In the charge pump circuit 21, an operational amplifier 22 is added to compensate for the glitch. The operational amplifier 22 has an inverting input terminal and an output terminal each connected to the node pb, and a non-inverting input terminal connected to the node pa, wherein it operates as a voltage follower to constantly keep the potential vb at the same value as the potential va.

Thus, even if the UP signal is changed in the aforementioned manner, the drain potential v1 of the transistor q3 is not changed, before and after the transition, so that the variation amount $\Delta Q_{ds3}$ of electric charges charged in the source-drain parasitic capacitance of the transistor q3 becomes zero. In this manner, a drain current value of the transistor q3 is constantly kept at the constant current ic, and a source current pulse waveform output from the charge pump circuit 21 is formed as a rectangular waveform having a maximum current value of ic, and no glitch.

While the above description has been made about glitch compensation for the current supplying (sourcing) operation of the charge pump 21 based on the PMOS transistors q5, q7, q3, glitch compensation is also performed for the current drawing operation of the charge pump 21 based on the NMOS transistors q6, q8, q4, in the same manner.

An error current arising from a drain-source parasitic capacitance of the current-source transistors q3, q4 becomes a major factor causing a slow glitch. As used herein, the term "slow glitch" means an error current having a slow attenuation which is observed during a period where an output current value converges to a steady current value (ic) after a rising edge of an output current pulse of a charge pump circuit. However, a glitch occurring in the output current pulse of the charge pump circuit also includes an extremely fast spike-like glitch occurring just after rising or falling of an input pulse, in addition to the slow glitch. The circuit illustrated in FIG. 9 cannot compensate for this type of glitch. The present invention is also not particularly intended to compensate for it.

In the above conventional charge pump circuit, a voltage follower composed of the operational amplifier 22 is added to the DSCP to output constant current pulses reduced in glitch. However, this technique involves the following disadvantages.

(i) Generally, an operational amplifier circuit is provided with a phase compensation capacitor to suppress unstable oscillation. An adequate capacitance value of the phase compensation capacitor is about several tens of pF, and thereby a relatively large on-die area is required to form the phase compensation capacitor in an integrated circuit. This becomes a factor causing an increase in production cost of a PLL IC.

(ii) In an operational amplifier for use in a glitch compensation circuit of a DSCP, it is preferable that a maximum output current value of the operational amplifier is equal to or greater than a charge-pump output current value. Thus, particularly, in a DSCP having a relatively large output current value, it is necessary to perform glitch compensation, using an operational amplifier which comprises an output stage with a relatively large maximum output current and has a relatively large on-die occupancy area. This also becomes a factor causing an increase in production cost of a PLL IC.

(iii) Generally, an operational amplifier in a glitch compensation circuit added to a DSCP is constantly in an operating state. Thus, due to the addition of the glitch compensation circuit, an amount of energy consumption of the DSCP is increased by the power consumption of the operational amplifier×an operating time. Consequently, an amount of energy consumption of a PLL IC is also increased, causing a shortening of battery run time in mobile applications.

SUMMARY OF THE INVENTION

In view of the above circumstances, it is an object of the present invention to provide a charge pump circuit having a low-cost and energy-saving DSCP glitch compensation circuit, and a PLL circuit using the charge pump circuit.

A charge pump circuit, and a PLL circuit using the charge pump circuit, according to the present invention, comprises a glitch compensation circuit to compensate for a slow glitch which occurs along charging/discharging of electric charges in a parasitic capacitance. The glitch compensation circuit includes a comparator, a latch circuit, a capacitor and a charge/discharge device. The comparator is operable to compare between given potentials and apply a logic output signal to the latch circuit, and the latch circuit is operable, in response to an output of the comparator at a given timing, to instruct the charge/discharge device to perform a charge or discharge operation to charge or discharge the capacitor so as to allow a potential at a second output terminal to come close to a potential at a first output terminal or a potential at a designated node in a loop filter of the PLL circuit. Thus, based on this configuration, the present invention can provide a low-cost and energy-saving charge pump circuit, and a PLL circuit using the charge pump circuit.

These and other objects, features and advantages of the present invention will become more apparent upon reading the following detailed description along with the accompanying drawings.

DETAILED DESCRIPTION OF THE PREFERRED EMBODIMENTS

Figure 1:
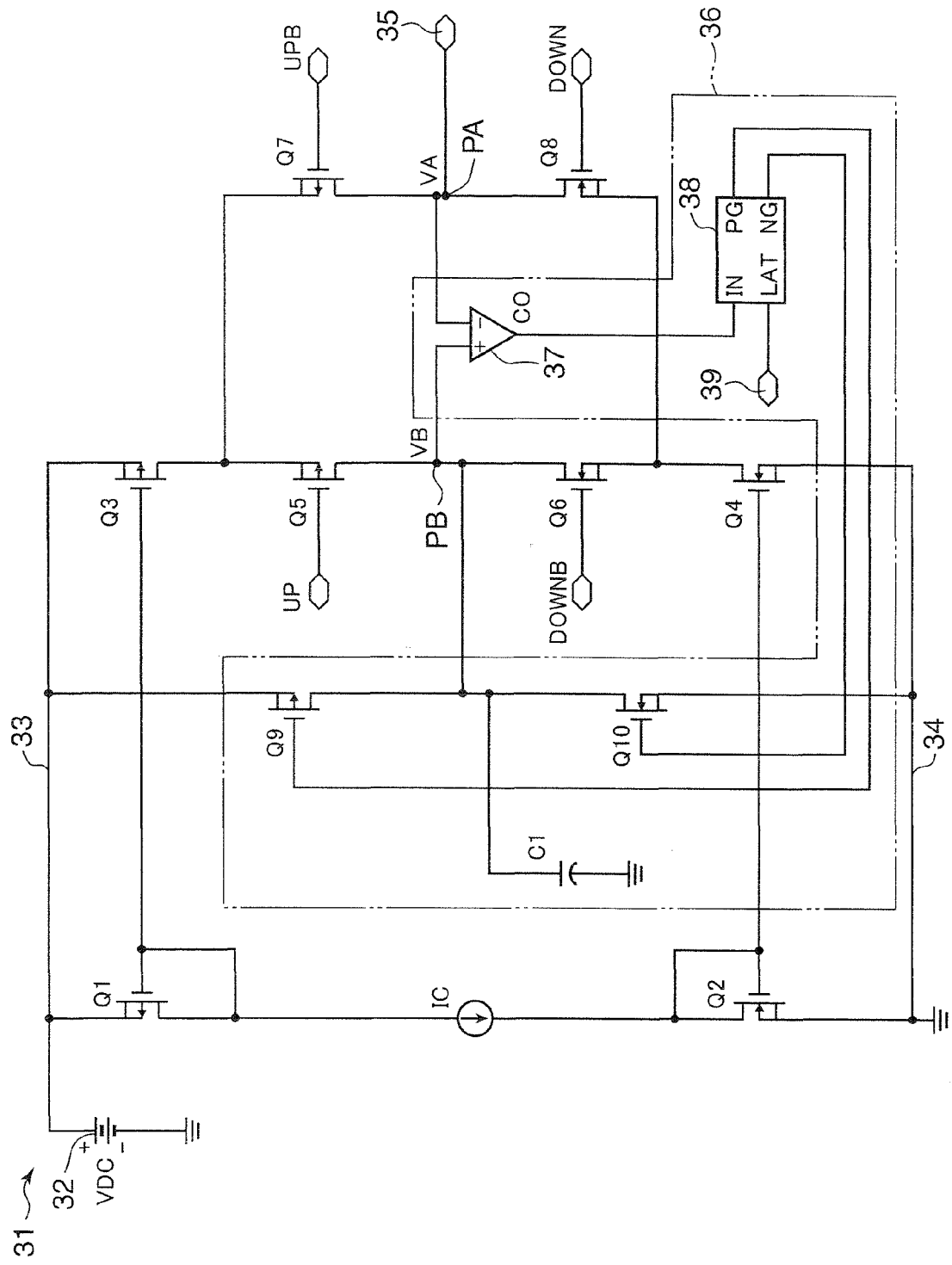
FIG. 1 is a circuit diagram of a charge pump circuit according to a first embodiment of the present invention.

With reference to the drawings, an embodiment of the present invention will now be described. In FIGS. 1 to 7, it is meant that two or more elements or components designated by a common reference numeral or code have the same structure or configuration, and their duplicated description will be omitted on a case-by-case basis.

First Embodiment

Figure 2:
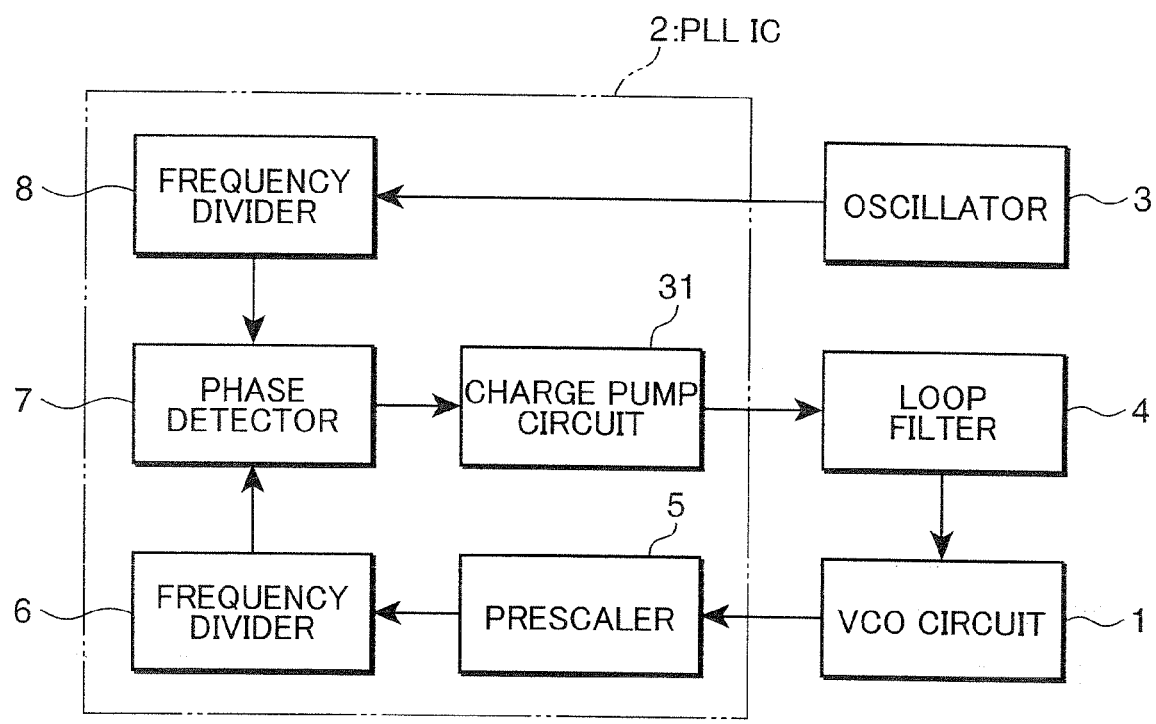
FIG. 2 is a circuit diagram of a PLL synthesizer using the charge pump circuit illustrated in FIG. 1.

FIG. 1 is a circuit diagram of a charge pump circuit 31 according to a first embodiment of the present invention. FIG. 2 is a circuit diagram of a PLL synthesizer using the charge pump circuit illustrated in FIG. 1.

Figure 7:
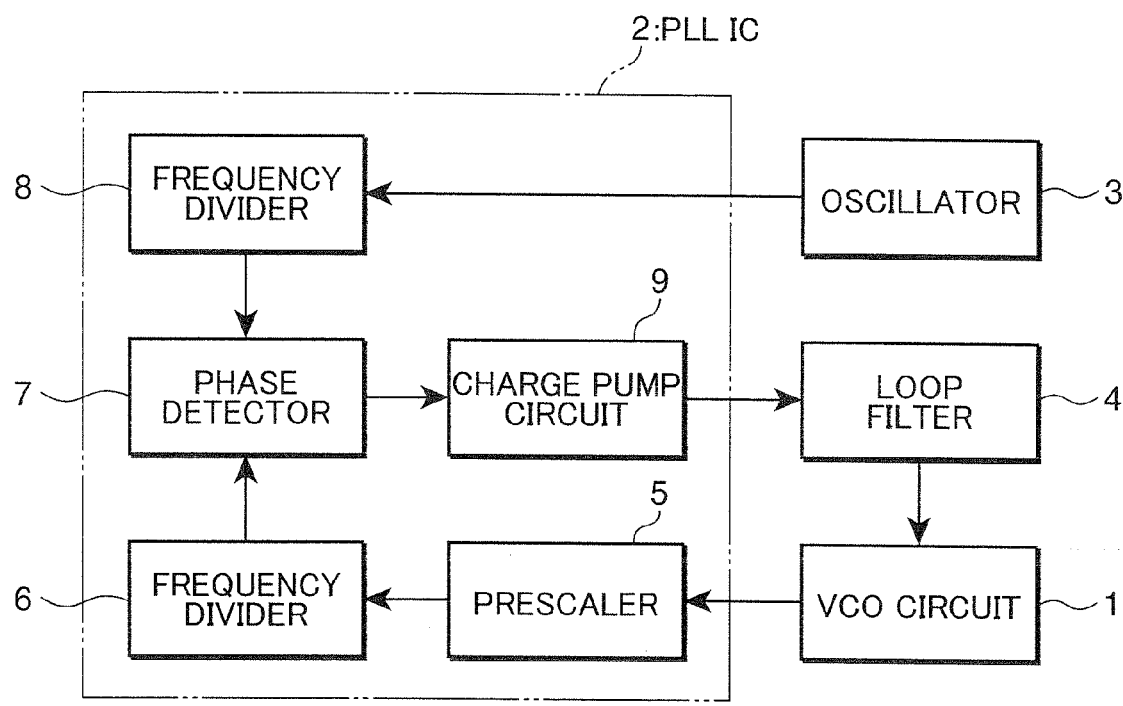
FIG. 7 is a block diagram showing one example of a configuration of a PLL synthesizer.
Figure 8:
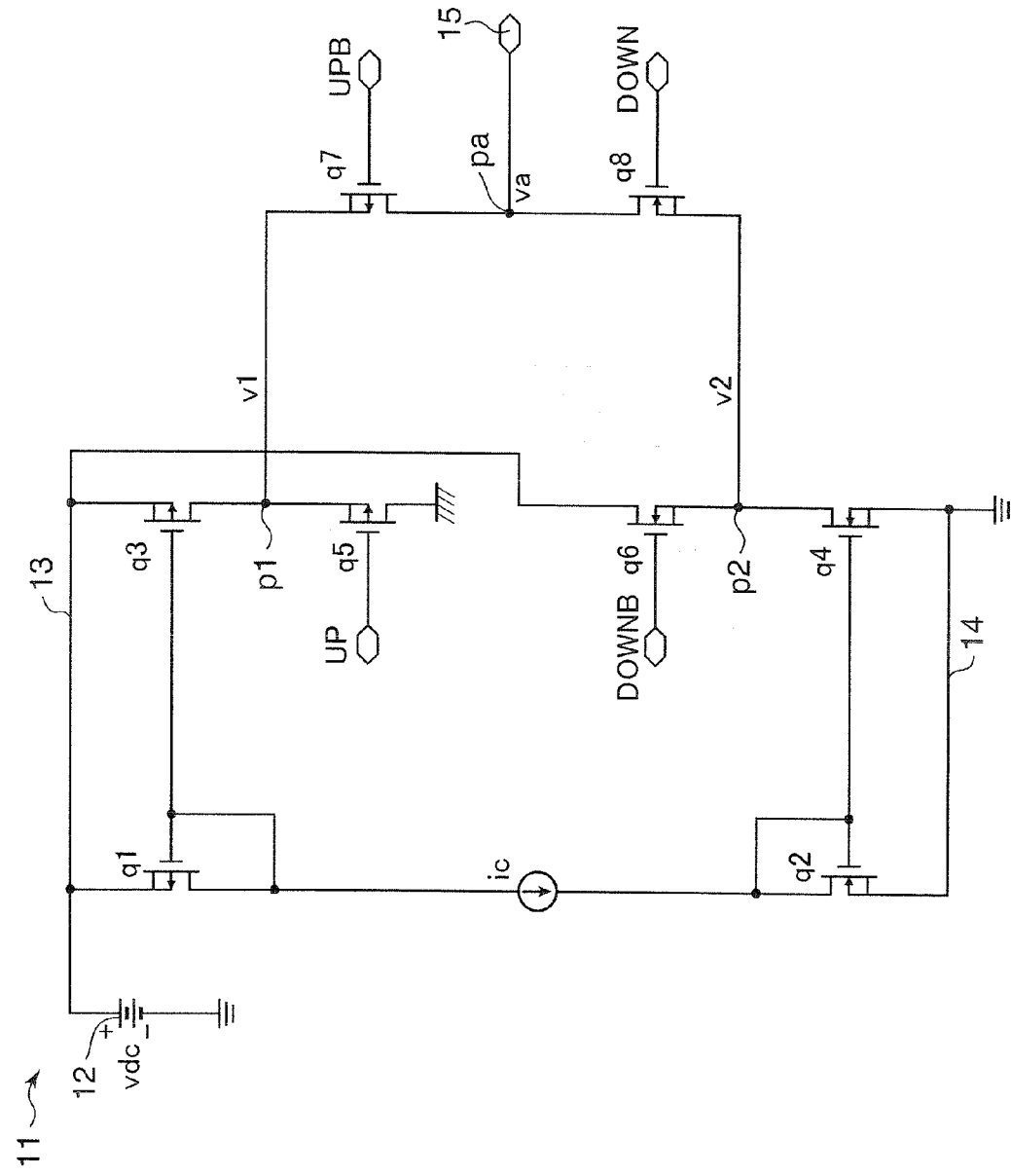
FIG. 8 is a circuit diagram of a typical charge pump circuit.

This charge pump circuit 31 is used as the charge pump circuit 9 in the PLL IC 2 illustrated in FIG. 7. Specifically, as shown in FIG. 2, a PLL synthesizer comprises a VCO 1, a PLL IC 2, an oscillator 3 and a loop filter 4. The PLL IC 2 includes a prescaler 5, a frequency divider 6, a phase detector 7, a frequency divider 8, and a charge pump circuit 31 serving as a substitute for the charge pump circuit 9 illustrated in FIG. 7. An oscillation signal of the VCO 1 is input into the PLL IC 2, wherein a frequency of the oscillation signal is divided at a predetermined frequency-dividing ratio by the prescaler 5 and further divided by the frequency divider 6, and a resulting signal is input into the phase detector 7 as a frequency-divided signal. Meanwhile, an oscillation signal of the reference oscillator 3 is input into the PLL IC 2, wherein a frequency of the oscillation signal is divided by the frequency divider 8, and a resulting signal is input into the phase detector 7 as a frequency-divided signal. In cases where the phase detector 7 is configured as a tri-state type, it is operable to compare between respective phases of the frequency-divided signal from the VCO 1 and the frequency-divided signal from the oscillator 3, and output an error signal having a pulse width with the same time period as a difference between the phases, for example, as an UP signal, if the phase difference is a positive value, or as a DOWN signal, if the phase difference is a negative value. As with the charge pump circuit 9, the charge pump circuit 31 is operable, when the UP signal is input thereinto, to output (source) a given current value $I_{CP}$ from an output terminal thereof, just for the same time period as a pulse width of the UP signal, or, when the DOWN signal is input thereinto, to draw a given current value $I_{CP}$ from the output terminal thereof, just for the same time period as a pulse width of the DOWN signal, or, when both the UP and DOWN signals are in an OFF state, to place the output terminal in a high impedance state.

As used herein, the term "PLL circuit" means an oscillator controller circuit designed to perform an stable oscillation operation while subjecting a VCO in a feedback loop to allow a phase and frequency difference between a reference signal input from outside and an output from the VCO in the loop to become zero, ideally. For example, the PLL circuit comprises a phase detector, a charge pump circuit, a loop filter and a VCO. In this case, the phase detector is operable to compare between respective phases of the reference signal input from the outside and a signal generated by the VCO, and output a resulting phase-difference signal to the charge pump circuit.

The charge pump circuit is operable to output an output current signal depending on the phase-difference signal, to the loop filter. The loop filter is operable to convert the output current signal depending on the phase-difference signal into a voltage signal and output the voltage signal to a control terminal of the VCO as a control signal. The VCO has a given self-running oscillation frequency, and is operable, in response to the control signal, to change the oscillation frequency to perform a phase matching operation with respect to the reference signal. In the PLL synthesizer, a frequency divider with a ratio of 1/N is further provided in the feedback loop of the above PLL circuit, more specifically, between the VCO and the phase detector, to make the VCO oscillate at a frequency N times higher than a frequency of an input reference signal.

In the charge pump circuit 31, as shown in FIG. 1, a diode-connected PMOS transistor Q1, a constant current source IC and a diode-connected NMOS transistor Q2 are connected in series between two power supply lines 33, 34 from a DC power supply 32 generating a power supply voltage VDC. A gate of the PMOS transistor Q1, and a gate of the NMOS transistor Q2, are connected, respectively, to a gate of a MOS transistor PQ3 of the same type and size as the PMOS transistor Q1, and a gate of a NMOS transistor Q4 of the same type and size as the NMOS transistor Q2, to form a current mirror circuits. A drain of the NMOS transistor Q4 is connected to a source of an NMOS transistor Q6 and a source of an NMOS transistor Q8. A drain of the PMOS transistor Q3 is connected to a source of a PMOS transistor Q5 and a source of a PMOS transistor Q7. The transistor Q3 corresponds to the aforementioned current-supplying (current-sourcing) constant current source, and the transistor Q4 corresponds to the aforementioned current-drawing constant current source. A drain of each of the transistors Q7, Q8 is connected to an output terminal 35 of the charge pump circuit 31, to provide the aforementioned main-output side current path. A drain of the transistor Q6 is connected to a drain of the transistor Q5 to provide the aforementioned auxiliary-output side current path. In cases where each of the UP signal and the DOWN signal from the phase detector 7 is output based on a positive logic, the UP signal, the DOWN signal, an UPB signal which is an inverted signal of the UP signal, and a DOWNB signal which is an inverted signal of the DOWN signal, are applied to a gate of the transistor Q5, a gate of the transistor Q8, a gate of the transistor Q7, and a gate of the transistor Q6, respectively.

In the first embodiment, the constant current source IC, the transistor Q1 and the transistor Q3 correspond to one example of a current-supplying (current-sourcing) constant current source. The constant current source IC, the transistor Q2 and the transistor Q4 correspond to one example of a current-drawing constant current source. The transistors Q7, Q8 correspond to one example of first and second switches. A node (connection point) PA between the respective drains of the transistors Q7, Q8 corresponds to one example of a first output terminal. The transistor Q7, the node PA and the transistor Q8 form one example of a main-output side current path. Further, the transistors Q5, Q6 correspond to one example of third and fourth switches. A node (connection point) PB between the respective drains of the transistors Q5, Q6 corresponds to one example of a second output terminal. The transistor Q5, the node PB and the transistor Q6 form one example of an auxiliary-output side current path.

It should be noted that the charge pump circuit 31 in the first embodiment is provided with a novel glitch compensation circuit 36. This glitch compensation circuit 36 comprises a comparator 37, a latch circuit 38 constituted of a logic circuit, a charge/discharge device constituted of two MOS transistors Q9, Q10, and a capacitor C1. The comparator 37 has a non-inverting input terminal connected to the node (connection point) PB between the respective drains of the transistors Q5, Q6, and an inverting input terminal connected to the node (connection point) PA between the respective drains of the transistors Q7, Q8. The PMOS transistor Q9 has a source connected to the positive power supply line 33, and a drain connected to the node PB. The NMOS transistor Q10 has a source connected to the negative power supply line 34, and a drain connected to the node PB. The capacitor C1 has one terminal connected to the node PB, and the other terminal connected to the negative power supply line 34 (ground). The latch circuit 38 has a terminal IN connected to an output terminal of the comparator 37, a terminal LAT connected to an input terminal 39, a terminal PG connected to a gate of the transistor Q9, and a terminal NG connected to a gate of the transistor Q10. The latch circuit 38 is operable to turn on/off each of the transistors Q9, Q10 so as to adjust an amount of electric charges held in the capacitor C1 to selectively increase and reduce a potential VB at the node PB. In the first embodiment, the transistor Q9 and the transistor Q10 corresponds to one example of a charge/discharge device.

In the charge pump circuit 31 configured as above, the comparator 37 is operable to compare a potential VA at the charge-pump output terminal 35 with the potential VB at the node PB, and, if VA>VB, to output a logic value "0", or, if VB>VA, to output a logic value "1". The PLL loop filter 4 is connected to the charge-pump output terminal 35, and the capacitor C1 is connected to the node PB, so that a slew rate of each of the potentials VA, VB becomes sufficiently lower than an operating speed of the comparator 37.

Then, in response to an output of the comparator 37, the PMOS transistor switch Q9 for charging the capacitor C1, and the NMOS transistor switch Q10 for discharging the capacitor C1, are controlled by the latch circuit 38. Specifically, a latch pulse signal LAT is applied from an external control logic circuit (which is not shown in FIG. 1) to the input terminal 39. The latch circuit 38 is configured to initiate a charge/discharge control operation at a time T1, for example, when the latch pulse signal is changed from "0" to "1".

More specifically, an output CO of the comparator 37 is input from the terminal IN to the latch circuit, and the latch circuit 38 is operable to record a logical value CO (T1) of the output CO at the time T1, on a register. Then, if CO (T1)="0", i.e., VA>VB, the latch circuit 38 is operable to set an PG output to "0", and set an NG output to "0". Thus, the PG output is input into the gate of the PMOS transistor Q9 to turn on the PMOS transistor Q9, and the NG output is input into the gate of the NMOS transistor Q10 to turn off the NMOS transistor Q10, so that charging of the capacitor C1 is started. Differently, if CO (T1)="1", i.e., VA<VB, the latch circuit 38 is operable to set the PG output to "1", and set the NG output to "1". Thus, the PMOS transistor Q9 is turned off, and the NMOS transistor Q10 is turned on, so that discharging of the capacitor C1 is started.

Typically, a capacitance value of the capacitor C1 and a size of each of the transistors Q9, Q10 are adjusted to set the slew rate of the potential VB to a value sufficiently greater than that of the potential VA. In this case, in the charging operation, a state transition from "VA>VB" to "VA<VB" occurs at a certain time T2 after the time T1. In response to this state transition, the output value of the comparator 37 is changed from "0" to "1" at a certain time T3 after the time T2. Similarly, in the discharging operation, a state transition from "VA<VB" to "VA>VB" occurs, and, in response to this state transition, the output value of the comparator 37 is changed from "1" to "0" at the time T3.

Therefore, the latch circuit 38 is operable, when the output value of the comparator 37 becomes identical to an inverted value of the value CO (T1), to change the PG output to "1" and change the NG output to "0" at a certain time T4 after the time T3 to stop the charging/discharging of the capacitor C1. Subsequently, the latch circuit 38 is operable to maintain the charging/discharging idle state until a next latch pulse signal is applied to the input terminal 39. Thus, after the time T4, the potential VA and the potential VB will be kept approximately equal to each other, as long as the potential VA is not changed. Further, as mentioned in connection with the conventional charge pump circuit in FIG. 9, when a current is output from the charge pump circuit 31 under the condition that the potential VA and the potential VB are equal to each other, the slow glitch does not occur, ideally. Thus, it is understood that this novel glitch compensation circuit 36 makes it possible to obtain charge-pump output current pulses reduced in glitch.

In the above description, a time period between the time T2 and the time T3 (i.e., the time T3–the time T2) corresponds to a response time of the comparator 37, and a time period between the time T3 and the time T4 (i.e., the time T4–the time T3) corresponds to a sum of a response time of the latch circuit 38 to an output of the comparator, and a response time of each of the transistors Q9, Q10. The time T2 when the potential VA and the potential VB actually become equal to each other, and the time T4 when the charging/discharging of the capacitor C1 is stopped, is different from each other by a finite time period, so that the charge/discharge operation is continued during this time period to cause a state of VA (T4)≠VB (T4), i.e., an error. Moreover, generally, the comparator 37 has a non-zero input offset voltage, and thereby an error occurs even under an assumption of an infinitely-fast response time.

It is possible to make an improvement to allow a value of "VA (T4)–VB (T4)" to come close to zero so as to cope with the above error factors. However, generally, even if such an error correction circuit were not particularly added, there is no problem, because the slow glitch seldom occurs when a difference between the potential VA and the potential VB is sufficiently small.

Figure 3:
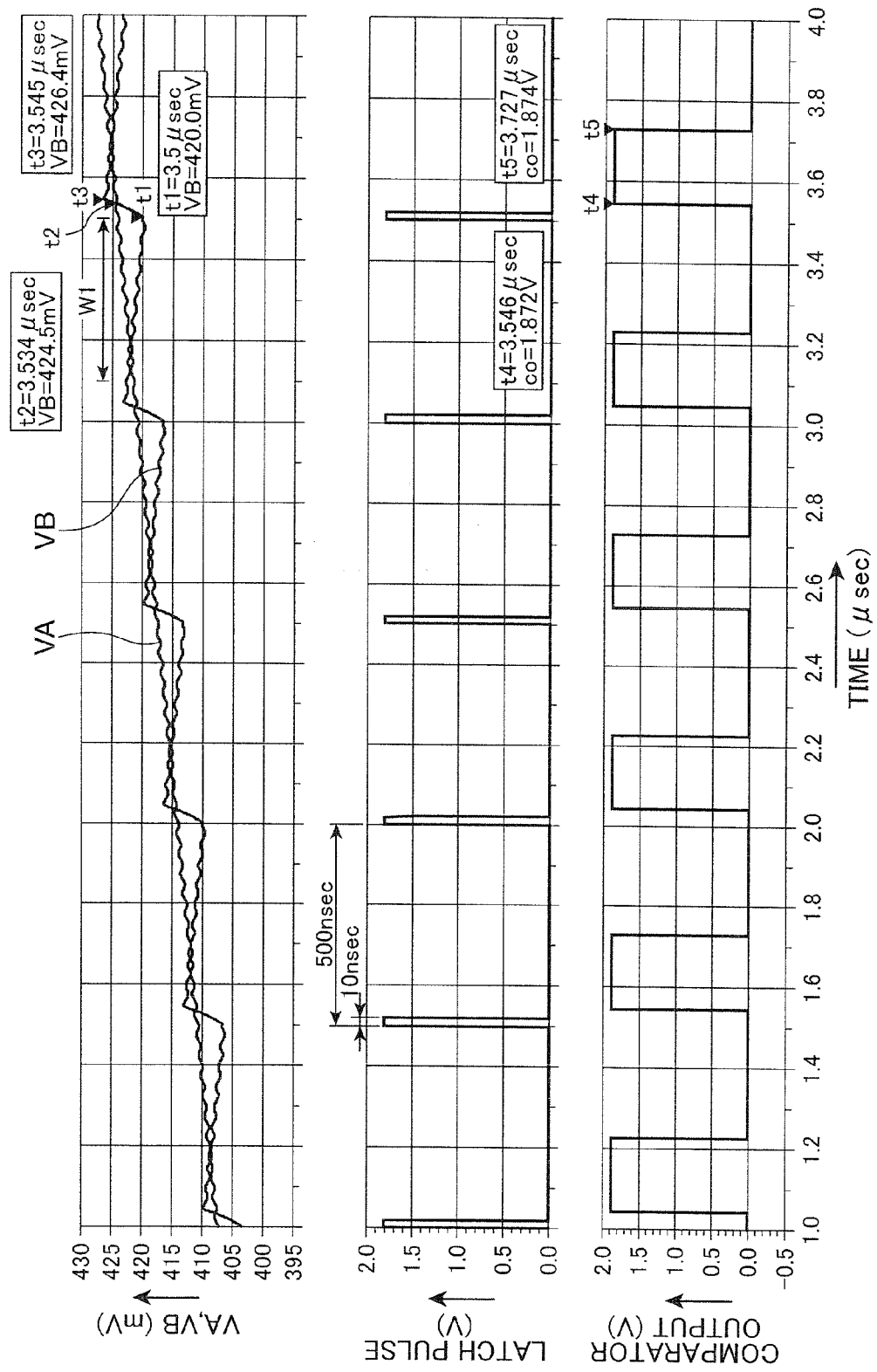
FIG. 3 is a graph showing a simulation result of the charge pump circuit illustrated in FIG. 1.

FIG. 3 is a graph showing a simulation result of an example where the first embodiment illustrated in FIG. 1 is realized as an actual integrated circuit. In this simulation, an UP signal having a cycle period of 50 nsec and a pulse width of 20 nsec, and a DOWN signal having a cycle period of 50 nsec and a pulse width of 10 nsec, were input into the charge pump circuit 31. Further, the DOWN signal was set to have a delay of 30 nsec relative to the UP signal. This setting is made for input signals on an assumption that the PLL is in an unlocked state. A current value IC of the constant current supply of the charge pump circuit 31 was set to 40 μA. Further, a latch signal LAT having a cycle period of 500 nsec and a pulse width of 10 nsec was input into the terminal LAT of the latch circuit 38. FIG. 3 shows respective transient responses of the potentials VA, VB, the latch pulse and the output logic value from the comparator 37 in a time period between 1.0 to 4.0 μsec after start of the simulation, downwardly in this order, wherein the abscissa represents a time, and the ordinate represents a voltage.

As seen in FIG. 3, the potential VA indicative of an output voltage of the charge pump circuit 31 is increased at a speed of about 6.7 mV/μsec. The reason is that the pulse width of the UP signal is greater than that of the Down signal by 10 nsec, and thereby an amount of electric charges charged in a capacitor of the loop filter 4 becomes greater than an amount of electric charges discharged from the capacitor, in a time average. Further, current pulses are output from the charge pump circuit 31 in a cycle period of 50 nsec, so that the potential VA finely oscillates.

Observing a time period where the glitch compensation circuit 36 is in an idle state, and each of the transistors Q9, Q10 is in an OFF state, for example a time period W1 between 3.1 to 3.5 μsec, the potential VB is gradually reduced while finely oscillating in a cycle period of 50 nsec. This shows that the pulse width of the DOWN signal input into the NMOS transistor Q6 is greater than that of the UP signal input into the PMOS transistor Q5 switching a current to be output from the node PB, by 10 nsec, and thereby an amount of electric charges discharged from the capacitor C1 becomes greater than an amount of electric charges charged in the capacitor C1, in a time average, to cause a reduction in electric charges held in the capacitor C1 and the voltage reduction.

Thus, if the UP and DOWN signals each having the above pulse width are continuously applied without performing the glitch compensation operation, an error in "VA–VB" is increased due to the increase in the potential VA and the reduction in the potential VB to cause a significant glitch in an output of the charge pump circuit 31. In the simulation illustrated in FIG. 3, the glitch compensation operation is performed by applying the latch pulses to the latch circuit 38 in a cycle period which is ten times greater than that of each of the UP and DOWN signals, i.e., a cycle period of 500 nsec. Thus, the potential VB is rapidly increased until the potential VB becomes greater than the potential VA (VB>VA) in each cycle period of 500 nsec, so that |VA–VB| is constantly kept at 5 mV or less.

The glitch compensation operation, for example, in a time period after a time point of 3.500 μsec (t1) will be described in detail in a time-series manner. Firstly, at the time point of 3.500 μsec (t1), the latch pulse signal LAT is input to direct initiation of the glitch compensation operation. In response to the latch pulse, the output logic value CO of the comparator 37 at the time t1 is stored in the latch circuit 38. At the time t1, the potential VA is about 423 mV, and the potential VB is 420 mV, which satisfies the relationship: VA>VB. Thus, the output logic value CO (t1) is "0". Further, in response to the fact that the output logic value CO (t1) is "0", the latch circuit 38 sets each of the PG output and the NG output to "0" to start charging of the capacitor C1.

During a time period where the capacitor C1 is charged, the potential VB is continuously increased, and the potential VB becomes equal to the potential VA at a time point of 3.534 μsec (t2). The comparator 37 operates at a finite speed and has a non-zero input offset voltage, so that an output value of the comparator 37 is not changed at the time t2. Then, at a time point of 3.545 μsec (t3), the comparator 37 inverts the output logic value CO from "0" to "1". The latch circuit 38 detects that the output logic value CO of the comparator 37 is changed to a value different from the CO (t1), and sets the PG output and the NG output, respectively, to "1" and "0", at a time point of 3.546 μsec (t4), to stop the charging/discharging of the capacitor C1. After the time t4, the latch circuit 38 will keep the charging/discharging idle state until next latch pulses are input. During this time period, an amount of electric charges discharged from the capacitor C1 is greater than an amount of electric charges charged in the capacitor C1, as mentioned above, so that the potential VB is reduced gradually and slowly. Thus, at a time point of 3.727 μsec (t5), a state transition from "VA<VB" to "VA>VB" occurs again, and the output logic value of the comparator 37 is inverted from "1" to "0".

Figure 4:
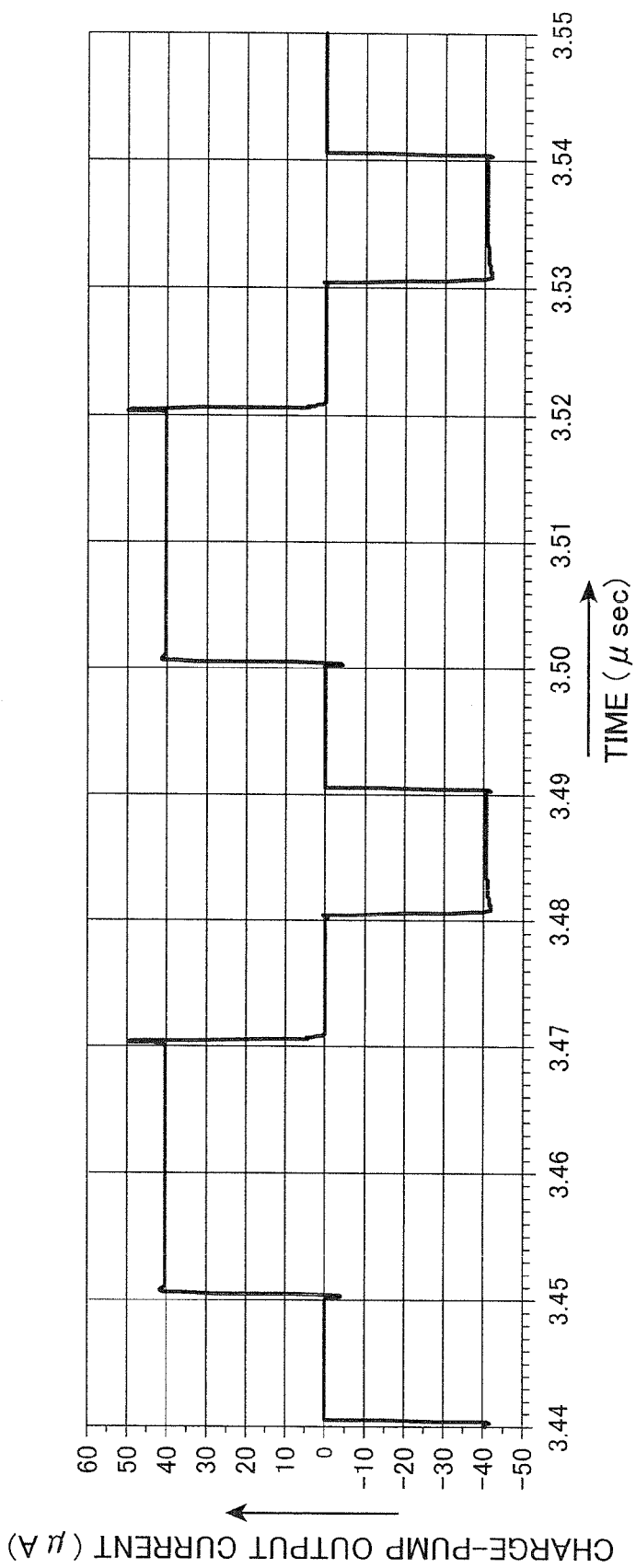
FIG. 4 is a graph enlargedly showing a part of an output current waveform from the charge pump circuit observed in the simulation in FIG. 3.

FIG. 4 shows an output current waveform from the charge pump circuit 31, observed by the same simulation as that in FIG. 3 in a time period of 3.44 to 3.55 μsec, wherein the ordinate represents a charge-pump output current value, and the abscissa represents a time. A positive value of the output current value corresponds to a source current, and a negative value of the output current value corresponds to a sink current. A source current pulse having a cycle period of 50 nsec and a pulse width of 20 nsec, and a sink current pulse having a cycle period of 50 nsec and a pulse width of 10 nsec, are output, wherein the sink current pulse is output with a delay of 30 nsec relative to the source current pulse. Although a spike-like glitch which is not a compensation target as mentioned above is observed at a pulse edge of the source current, each of a source current pulse having an amplitude of 40 μA, and a sink current pulse having an amplitude of −40 μA, is output in an approximately accurate size and pulse width, almost without the slow glitch.

As above, based on employing the glitch compensation circuit 36, a glitch in output current pulses of the DSCP circuit can be reduced. Further, the comparator 37 as one of element blocks of the glitch compensation circuit 36 has no need to use a phase-compensation capacitor which is generally used in an operational amplifier circuit. Thus, it becomes possible to omit an on-die area for forming a capacitor, and mount the comparator 37 as a circuit having an area less than that of the operational amplifier 22.

As a prerequisite to allowing the conventional charge pump circuit 21 to have a particularly large output current, it is necessary to design the glitch-compensating operational amplifier 22 to have a robust high current output stage, i.e., as a circuit having a large on-die occupancy area. In contrast, the comparator 37 in the glitch compensation circuit 36 can operate as long as a fan-out of its output is one or more, so that an output buffer thereof can be designed as a high-speed type having a small area.

In addition to the comparator 37, the glitch compensation circuit 36 includes the latch circuit 38, the charging/discharging switching transistors Q9, Q10, and the capacitor C1. While the capacitor C1 is realized as an external component generally, the latch circuit 38 can be mounted as a small high-speed logic circuit using a transistor having a minimum size allowable in terms of manufacturing semiconductor process specifications. Thus, as compared with the comparator 37, an on-die occupancy area of the latch circuit 38 becomes extremely smaller. Further, generally, even if each of the transistors Q9, Q10 is designed as an element having a small on-die area, it can provide a sufficiently large charging/discharging current to the capacitor C1 to operate the glitch compensation circuit 36 without any problems.

Figure 9:
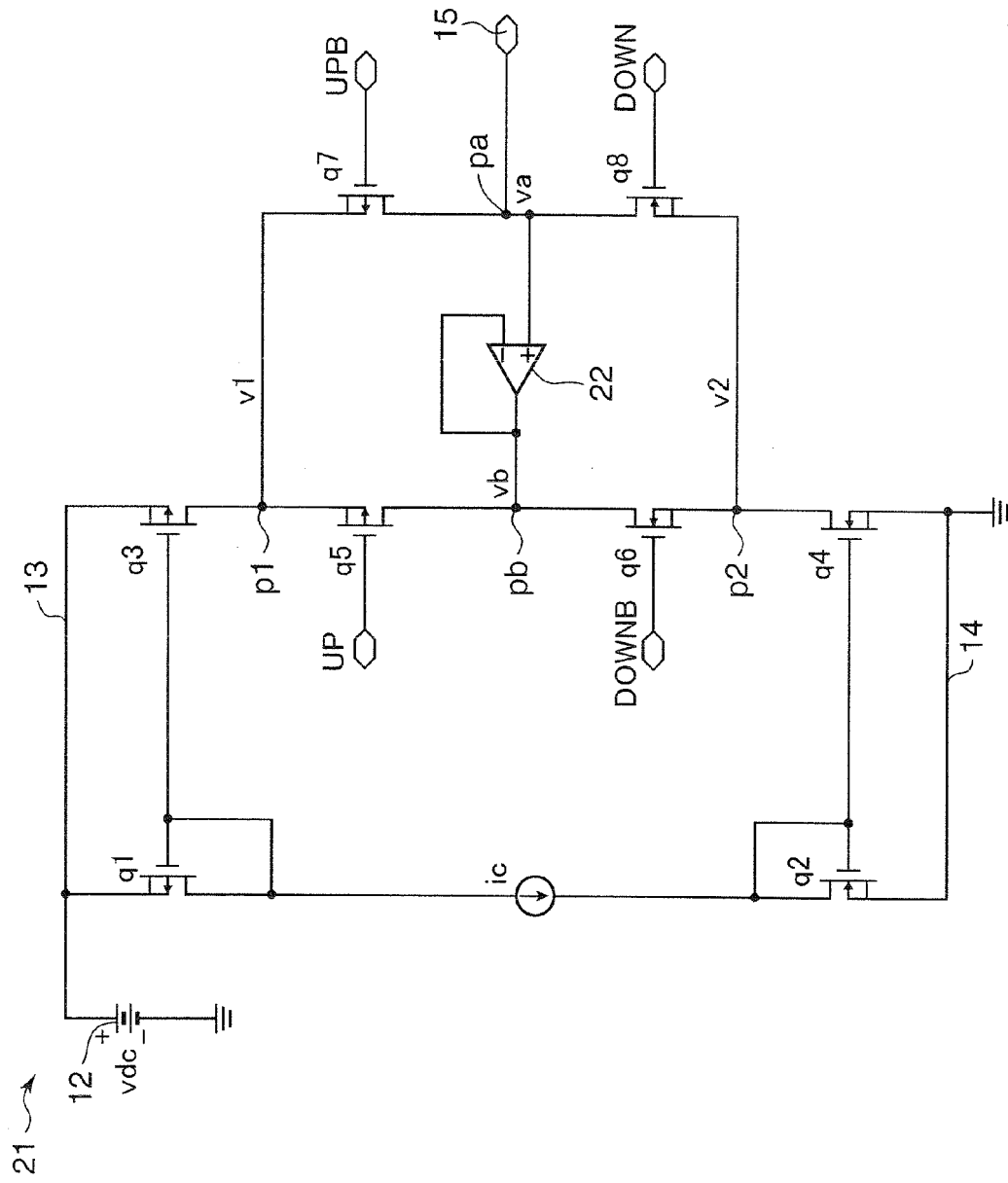
FIG. 9 is a circuit diagram of a charge pump circuit disclosed in the document D1.

For the above reasons, an on-die occupancy area of the entire glitch compensation circuit 36 can be reduced to be smaller than that of the glitch compensation circuit 21 using the operational amplifier 22, as shown in FIG. 9, so that the glitch compensation circuit 36 can be mounted on an integrated circuit at a lower cost.

Typically, a PLL circuit is used in a locked state, and an amount of electric charges output from a charge pump circuit in the locked state becomes approximately zero in a time average. Similarly, during an operation of synthesizing a narrowband modulated signal from the PLL, an output DC voltage of the charge pump circuit is little changed. As to an amount of power consumption of the conventional glitch compensation circuit using the operational amplifier 22 as shown in FIG. 9, under the condition that the PLL is in the locked state, the operational amplifier 22 is incessantly in operation, and operable to source/sink a certain level of compensation current pulse successively in response to every output current pulse from the charge pump circuit 21. This means that an amount of electric power greater than an amount of power consumption in an idle state of the operational amplifier 22 is consumed in time average.

In contrast, when a PLL circuit using the charge pump circuit in FIG. 1 is in a locked state, an amount of electric charges output to the loop filter 4 and the capacitor C1 becomes approximately zero in a time average, as mentioned above. Thus, each of the potential VA and the potential VB is kept at an approximately constant value. While the glitch compensation circuit 36 repeatedly performs the correction operation to allow the potential VA and the potential VB to become equal to each other, at time intervals designated by the latch pulse signal LAT, the need for the correction operation is almost eliminated in the locked state. Thus, in the locked state, the time interval for performing the correction operation can be increased without spoiling the compensation function of the glitch compensation circuit 36. Based on reducing an operating time of the glitch compensation circuit 36 and increasing the idle time in the locked state, per unit time unnecessary charging/discharging for the capacitor C1 can be omitted to reduce power consumption of the glitch compensation circuit 36 in time average. Particularly, in cases where a pulse interval of the latch pulse signal LAT can be sufficiently increased, when the PLL is in the locked state, the comparator 37 can be shut down or placed in a standby state at idle to facilitate energy saving.

For the above reasons, the PLL circuit using the charge pump circuit 31, according to the first embodiment, can significantly reduce energy consumption or power consumption in time average, particularly, in the locked state, as compared with a PLL circuit using the conventional charge pump circuit 21 illustrated in FIG. 9.

When the PLL circuit is in the unlocked state, the potential VA is significantly changed over time. Thus, if the correction of the potential VB based on the charging/discharging for the capacitor C1 is not performed at a sufficiently high speed, or the latch pulse signal LAT is given with insufficient frequency, |VA−VB| is transiently increased to cause a glitch. However, the PLL circuit is generally used in the locked state, which means that a state transition from the unlocked state to a steady locked state, always occurs, and |VA−VB| will converge toward zero anyway even if the speed of correction of the potential VB is relatively low, causing a large glitch in the charge pump output. Thus, depending on PLL settling time specifications, it is not particularly necessary to suppress the occurrence of a glitch in the unlocked state, and no problem will occurs even if the frequency of correction or the slew rate of the potential VB is set to a relatively low value.

A slew rate of the potential VA depends on an output current value of the charge pump circuit 31 and characteristics of the loop filter 4. The slew rate of the potential VB depends on a capacitance value Cb of the capacitor C1, and a size of each of the charging/discharging transistors Q9, Q10. These parameters may be set to a suitable value to allow the potential VB to follow a change in the potential VA at a desired speed.

Second Embodiment

Figure 5:
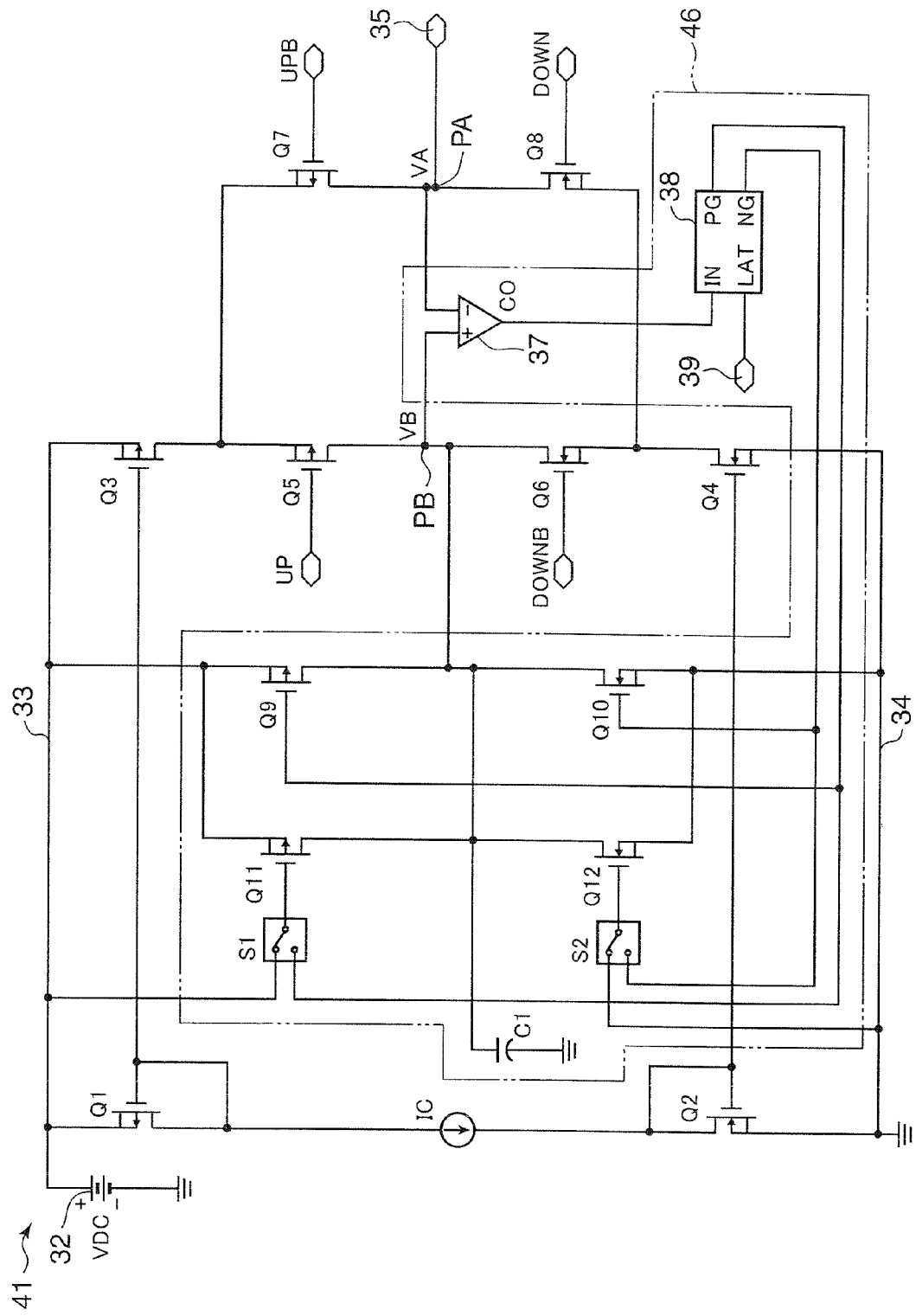
FIG. 5 is a circuit diagram of a charge pump circuit according to a second embodiment of the present invention.

FIG. 5 is a circuit diagram of a charge pump circuit 41 which is a DSCP, according to a second embodiment of the present invention. This charge pump circuit 41 is similar to the aforementioned charge pump circuit 31. Thus, an element or component corresponding to that in the charge pump circuit 31 is defined by a common reference numeral or code, and its description will be omitted. It is noted that, in a glitch compensation circuit 46 of the charge pump circuit 41 according to the second embodiment, a PMOS transistor Q11 and an NMOS transistor Q12 are connected in parallel, respectively, to a PMOS transistor 9 for charging a capacitor C1 and an NMOS transistor 10 for discharging the capacitor C1, and a switch S1 and a switch S2 are connected, respectively, to a gate of the MOS transistor Q11 and a gate of the MOS transistor Q12, in such a manner to apply, to a respective one of the gates, the same input as that for a corresponding one of the MOS transistors Q9, Q10, or to connect the gates, respectively, to high-level and low-level power supply lines 33, 34, to allow each of the transistors Q11, Q12 to be selectively placed in an OFF state. Each of the switches S1, S2 is adapted to be controllably switched by an external control circuit (which is not illustrated in FIG. 5). Given that each of the corresponding transistors Q9, Q11; Q10, Q12 has the same size, the switching control is configured to, during glitch compensation, select one of an operation of setting a slew-rate of a potential VB to a certain value SVB by using the transistors Q9, Q10 to charge/discharge the capacitor C1, and an operation of setting the slew-rate to twice as large value 2 SVB, by using the transistors Q9, Q11, Q10, Q12 to charge/discharge the capacitor C1.

In the second embodiment, the positive power supply line 33 corresponds to one example of a power supply line for providing a regulated positive voltage, and the negative power supply line 34 corresponds to a ground line. The transistor Q9 and the transistor Q11 correspond to one example of a plurality of charging switches, and the transistor Q10 and the transistor Q12 correspond to one example of a plurality of discharging switches. Further, the switches S1, S2 correspond to one example of a selection circuit in a charge/discharge device.

Glitch compensation based on the second embodiment, i.e., in the DSCP adapted to change an output current value in a stepwise manner, will be described below. As mentioned above, each of a slew rate of a potential VA and an error |VA−VB| is increased in proportion to an output current value of the charge pump circuit. For this reason, in a PLL circuit using a capacitor C1 and a loop filter 4 with fixed circuit constants, if there is a need for suppressing a glitch in an output of a charge pump circuit, particularly, in an unlock state, it is necessary to increase a charging/discharging current value for the capacitor C1 in response to an increase in the output current value of the charge pump circuit, to increase a correction slew rate of the potential VB.

Therefore, in the glitch compensation circuit 46 illustrated in FIG. 5, for example, in cases where it is configured to be capable of changing the output current value of the charge pump circuit 41 between IC and 2 IC, the slew rate of the potential VB can be switched between SVB and 2 SVB in response to the change in the output current value, to perform the glitch compensation at an adequate speed. Although the charge pump circuit 41 in FIG. 5 is shown as one example where the slew-rate of the potential VB is switched in a two-stage manner, the number of switching stages can be easily increased to three or more.

Third Embodiment

Figure 6:
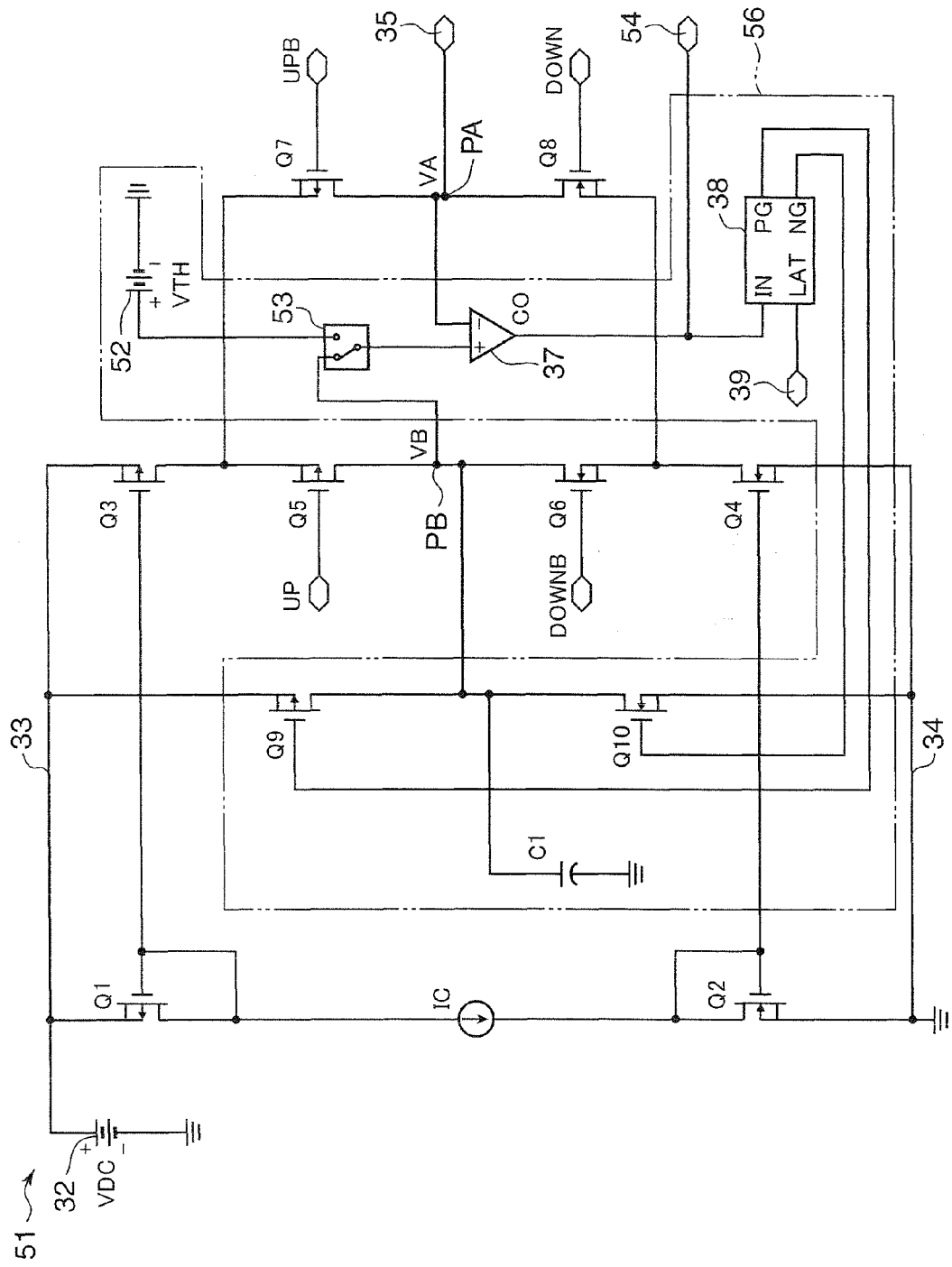
FIG. 6 is a circuit diagram of a charge pump circuit according to a third embodiment of the present invention.

FIG. 6 is a circuit diagram of a charge pump circuit 51 which is a DSCP, according to a third embodiment of the present invention. This charge pump circuit 51 is similar to the aforementioned charge pump circuit 31. Thus, an element or component corresponding to that in the charge pump circuit 31 is defined by a common reference numeral or code, and its description will be omitted. It is noted that a glitch compensation circuit 56 of the charge pump circuit 51 according to the third embodiment comprises a DC voltage reference 52 for providing a given reference voltage VTH, a switch 53 operable to selectively connect a node PB or a positive terminal of the DC voltage reference 52 to a non-inverting terminal of a comparator 37, and an output terminal 54 connected to an output of the comparator 37.

As mentioned above, particularly, when a PLL circuit is in a locked state, a glitch compensation operation can be performed without any problems, even if a cycle period of a latch pulse signal LAT to be applied to a latch circuit 38 is increased by an external control circuit. In the third embodiment, the charge pump circuit 51 is configured to allow the comparator 37 to be used for other purposes, when the cycle period is relatively long, i.e., an idle period where the glitch compensation circuit 56 stops charging/discharging of a capacitor C1, is relatively long. Specifically, in the charge pump circuit illustrated in FIG. 6, if there is a need for comparing an output voltage VA of the charge pump circuit 51 with the reference voltage VTH, the comparison is performed using the comparator 37 of the glitch compensation circuit 56. The switching of the switch 53 is performed according to a control signal from the external control circuit.

At a timing when the glitch compensation circuit 56 enters the idle period, the switch 53 is switched to allow the reference voltage VTH to be input into the non-inverting terminal of the comparator 37, and then an output logic value CO of the comparator is read from the output terminal 54 by an appropriate logic circuit, so that the output voltage VA of the charge pump circuit 51 can be compared with the reference voltage VTH. Subsequently, before a next glitch compensation operation is initiated, the switch 53 is re-switched to allow the potential VB to be input into the non-inverting terminal of the comparator 37. The above process can be repeatedly performed in the cycle period of the latch pulse signal LAT. This makes it possible to perform glitch compensation, and determination on an output voltage level of the charge pump circuit 51, using the single comparator 37. Various modifications may be made in the embodiment illustrated in FIG. 6. For example, another switch may be provided to an inverting input terminal of the comparator 37 to switch between two input signals, or it may be configured to allow three or more input signals to be selectively input.

In the third embodiment, if a certain block in a chip mounting the PLL circuit has a need for using a comparator for specific purpose different from glitch compensation, the comparator 37 used for the glitch compensation may be used in such a manner that an input signal for the specific purpose is input thereinto in a time-division manner, utilizing the idle period of the comparator 37, and an obtained comparison result is referred to on a timely basis. This makes it possible to eliminate the need for additionally providing a comparator to save a die area and facilitate a reduction in cost.

In the first, second and third embodiment, the potential VA of the charge-pump output terminal 35 and the potential VB at the node PB are applied to the input terminal of the comparator. Alternatively, depending on a network topology of loop filter 4 for use in the PLL circuit, a potential VLP at a suitable node inside the loop filter 4 and the potential VB at the node PB may be input into the comparator.

This specification discloses the aforementioned arrangements. The following is a summary of the primary arrangements of the present invention.

According to an aspect, there is provided a charge pump circuit which comprises: a current-supplying constant current source; a current-drawing constant current source; a main-output side current path including series-connected first and second switching elements provided between the two current sources, wherein a connection point between the first and second switching elements serves as a first output terminal; an auxiliary-output side current path including series-connected third and fourth switching elements provided between the two current sources, wherein a connection point between the third and fourth switching elements serves as a second output terminal; and a glitch compensation circuit including: a comparator operable to compare a potential at the first output terminal or a potential at a designated node in a loop filter connected to the first output terminal, with a potential at the second output terminal; a latch circuit operable to store, as a first output value, an output value of the comparator at a given first timing designated from the outside, and output a charging or discharging instruction according to the first output value, whereafter the latch circuit is operable to successively compare an output value of the comparator after the first timing, with the first output value, and, at a second timing when the output value of the comparator and the first output value become non-identical, to issue a charging/discharging stop instruction; a capacitor connected between the second output terminal and a ground point; and a charge/discharge device operable, in response to an output of the latch circuit, to selectively charge and discharge the capacitor.

The charge pump circuit of the present invention is a differential switching type which comprises: a current-supplying constant current source; a current-drawing constant current source; a main-output side current path including series-connected first and second switching elements provided between the two current sources, wherein a connection point between the first and second switching elements serves as a first output terminal; and an auxiliary-output side current path including series-connected third and fourth switching elements provided between the two current sources, wherein the auxiliary-output side current path is connected in parallel with the main-output side current path, and a connection point between the third and fourth switching elements serves as a second output terminal, and wherein the first to fourth switching elements are operable, according to an external drive signal from a phase detector or the like, to select one of a current path for a supply (source) current flow and a current path for a sink current flow to start or stop outputting a positive or negative constant current from the first output terminal. With a view to compensate for a slow glitch occurring along charging/discharging of a parasitic capacitance of the constant current sources, due to a difference between a potential at the first output terminal or a potential at a node in a loop filter connected to the first output terminal, and a potential at the second output terminal, the charge pump circuit includes a novel glitch compensation circuit using a comparator, a latch circuit, a capacitor and a charge/discharge device, in place of a conventional operational amplifier serving as a voltage follower.

More specifically, the comparator is operable to compare between potentials and apply a logic output signal to the latch circuit. In response to a timing input signal applied to the latch circuit, a glitch compensation operation is initiated. The latch circuit is operable, depending on an output of the comparator at a given timing, to instruct the charge/discharge device to perform an operation of charging or discharging the capacitor. According to the instruction, the latch circuit is operable to allow the potential at the second output terminal to come close to the potential at the first output terminal or the potential at the designated node in the loop filter. Specifically, the latch circuit is operable to store, as a first output value, an output value of the comparator at a first timing designated by the timing input signal, and output a charging or discharging instruction according to the first output value. Further, the latch circuit is operable to successively compare an output value of the comparator after the first timing, with the first output value, and, at a second timing when the output value of the comparator and the first output value become non-identical, to issue a charging/discharging stop instruction.

In the above charge pump circuit, the glitch compensation operation is performed discretely and repeatedly by applying the timing input signal at adequate time intervals. Thus, it becomes possible to allow the potential at the second output terminal, and the potential at the first output terminal or the potential at the designated node in the loop filter, to fall within a certain error range, so as to achieve a reduction in glitch.

Thus, the glitch compensation circuit employing a comparator can dispense with the aforementioned phase compensation capacitor incorporated in the operational amplifier. Consequently, the above charge pump circuit makes it possible to reduce an on-die area, and to suppress a production cost of an integrated circuit. Further, the charge/discharge device for selectively charging and discharging the capacitor can be realized using an on-die area less than that for the output stage of the operational amplifier. The operational amplifier used in the conventional charge pump circuit constantly consumes current due to a voltage follower operation. In contrast, the charge/discharge device in the above charge pump circuit can almost eliminate the need for performing the charging/discharging operation, in a locked state, which makes it possible to significantly reduce power consumption.

According to another aspect, in the above charge pump circuit, the charge/discharge device of the glitch compensation circuit includes a plurality of charging switches connected in parallel to each other between the second output terminal and a power supply line for providing a regulated given positive voltage, and a plurality of discharging switches connected in parallel to each other between the second output terminal and a ground point, and the glitch compensation circuit includes a circuit operable to select whether at least a part of the charging and discharging switches are controlled by the charging/discharging instruction output from the latch circuit, or placed in an open state.

In the above glitch compensation circuit, the charging and discharging switches constituting the charge/discharge device are provided as means to adjust a slew-rate of the potential at the second output terminal, and composed of N parallel-connected switches (wherein N is an fixed integer of two or more). A of the N parallel-connected switches (wherein A is a variable integer of 0 or more, and satisfies the following relation: A<N) are constantly placed in an open state. In an operation of increasing the slew-rate, the A is reduced, whereas, in an operation of reducing the slew-rate, the A is increased.

Thus, even in a differential switching charge pump circuit adapted to change an output current value thereof, the above charge pump circuit can increase/decrease the slew rate in response to an increase/decrease of a slew rate of a charge-pump output voltage to perform the glitch compensation at an adequate speed.

In the above charge pump circuit, an output of the comparator in the above glitch compensation circuit may be changed in any manner as long as it is not acquired by the latch circuit connected to the output of the comparator. With a view to further utilizing the comparator, the glitch compensation circuit is provided with a circuit for selecting one of an operation of applying individual input signals to one or both of two input terminals of the comparator, and the comparator is separated from the first and/or second output terminals for allowing another input. Further, the glitch compensation circuit is provided with an output terminal for extracting the output of the comparator. Thus, the comparator can be used for another purpose during a period after the second timing and when the charging/discharging of the capacitor is stopped Thus, if a certain block in an integrated circuit with the charge pump circuit has a need for using a comparator for specific purpose different from glitch compensation, the comparator used in the glitch compensation circuit can be utilized for the specific purpose during an idle period thereof This makes it possible to eliminate the need for additionally providing a comparator to save a die area and facilitate a reduction in production cost.

According to another aspect, in the above charge pump circuit, there is provided a PLL circuit comprising the above charge pump circuit.

In the PLL circuit of the present invention, the above charge pump circuit is suitable for the PLL circuit required to operate at high speeds and output a current pulse in a precise magnitude and time width, and capable of suppressing deterioration in performance of the PLL circuit due to glitch.

This application is based on Japanese Patent Application Serial No. 2009-195294, filed in Japan Patent Office on Aug. 26, 2009, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A charge pump circuit comprising:
a current-supplying constant current source;
a current-drawing constant current source;
a main-output side current path including series-connected first and second switching elements provided between the two current sources, wherein a connection point between the first and second switching elements serves as a first output terminal;
an auxiliary-output side current path including series-connected third and fourth switching elements provided between the two current sources, wherein a connection point between the third and fourth switching elements serves as a second output terminal; and
a glitch compensation circuit including:
a comparator operable to compare a potential at the first output terminal or a potential at a designated node in a loop filter connected to the first output terminal, with a potential at the second output terminal;
a latch circuit operable to store, as a first output value, an output value of the comparator at a given first timing designated from the outside, and output a charging or discharging instruction according to the first output value, whereafter the latch circuit is operable to successively compare an output value of the comparator after the first timing, with the first output value, and, at a second timing when the output value of the comparator and the first output value become non-identical, to issue a charging/discharging stop instruction;
a capacitor connected between the second output terminal and a ground point; and
a charge/discharge device operable, in response to an output of the latch circuit, to selectively charge and discharge the capacitor.

2. The charge pump circuit as defined in claim 1, wherein:
the charge/discharge device of the glitch compensation circuit includes a plurality of charging switches connected in parallel to each other between the second output terminal and a power supply line for providing a regulated given positive voltage, and a plurality of discharging switches connected in parallel to each other between the second output terminal and a ground point; and
the glitch compensation circuit includes a circuit operable to select whether at least a part of the charging and discharging switches are controlled by the charging/discharging instruction output from the latch circuit, or placed in an open state.

3. The charge pump circuit as defined in claim 1, wherein the glitch compensation circuit includes: a circuit operable to select one of an operation of applying an individual input signal and an operation of applying the potential recited in claim 1 to one or both of two input terminals of the comparator; and an output terminal for extracting the output of the comparator, whereby the comparator can be used for another purpose during a period after the second timing and when the charging/discharging of the capacitor is stopped.

4. A PLL circuit using a charge pump circuit, wherein the charge pump circuit comprises:
a current-supplying constant current source;
a current-drawing constant current source;
a main-output side current path including series-connected first and second switching elements provided between the two current sources, wherein a connection point between the first and second switching elements serves as a first output terminal;
an auxiliary-output side current path including series-connected third and fourth switching elements provided between the two current sources, wherein a connection point between the third and fourth switching elements serves as a second output terminal; and
a glitch compensation circuit including:
a comparator operable to compare a potential at the first output terminal or a potential at a designated node in a loop filter connected to the first output terminal, with a potential at the second output terminal;
a latch circuit operable to store, as a first output value, an output value of the comparator at a given first timing designated from the outside, and output a charging or discharging instruction according to the first output value, whereafter the latch circuit is operable to successively compare an output value of the comparator after the first timing, with the first output value, and, at a second timing when the output value of the comparator and the first output value become non-identical, to issue a charging/discharging stop instruction;
a capacitor connected between the second output terminal and a ground point; and
a charge/discharge device operable, in response to an output of the latch circuit, to selectively charge and discharge the capacitor.

5. The PLL circuit as defined in claim 4, wherein:
the charge/discharge device of the glitch compensation circuit includes a plurality of charging switches connected in parallel to each other between the second output terminal and a power supply line for providing a regulated given positive voltage, and a plurality of discharging switches connected in parallel to each other between the second output terminal and a ground point; and the glitch compensation circuit includes a circuit operable to select whether at least a part of the charging and discharging switches are controlled by the charge/discharge circuit according to the charging/discharging instruction output from the latch circuit, or placed in an open state.

6. The PLL circuit as defined in claim 4, wherein the glitch compensation circuit includes: a circuit operable to select one of an operation of applying an individual input signal and an operation of applying the potential recited in claim 4 to one or both of two input terminals of the comparator; and an output terminal for extracting the output of the comparator, whereby the comparator can be used for another purpose during a period after the second timing and when the charging/discharging of the capacitor is stopped.

* * * * *